United States Patent
Huai et al.

(10) Patent No.: US 7,241,631 B2
(45) Date of Patent: Jul. 10, 2007

(54) MTJ ELEMENTS WITH HIGH SPIN POLARIZATION LAYERS CONFIGURED FOR SPIN-TRANSFER SWITCHING AND SPINTRONICS DEVICES USING THE MAGNETIC ELEMENTS

(75) Inventors: Yiming Huai, Pleasanton, CA (US); Mahendra Pakala, Fremont, CA (US)

(73) Assignee: Grandis, Inc., Milpitas, CA (US)

( * ) Notice: Subject to any disclaimer, the term of this patent is extended or adjusted under 35 U.S.C. 154(b) by 226 days.

(21) Appl. No.: 11/027,397

(22) Filed: Dec. 29, 2004

(65) Prior Publication Data
US 2006/0141640 A1   Jun. 29, 2006

(51) Int. Cl.
*H01L 21/00* (2006.01)
*H01L 29/76* (2006.01)

(52) U.S. Cl. .................... 438/3; 257/295; 257/421
(58) Field of Classification Search .............. 438/3, 438/48; 257/295, 421, 422, 659
See application file for complete search history.

(56) References Cited

U.S. PATENT DOCUMENTS

| | | | |
|---|---|---|---|
| 6,451,215 B1* | 9/2002 | Shimazawa et al. | 438/3 |
| 6,621,666 B2* | 9/2003 | Miyauchi et al. | 360/324.12 |
| 6,714,444 B2 | 3/2004 | Huai et al. | |
| 6,844,204 B2* | 1/2005 | Asao | 438/3 |
| 6,920,063 B2 | 7/2005 | Huai et al. | |
| 6,921,954 B2* | 7/2005 | Sharma | 257/421 |
| 2004/0137645 A1* | 7/2004 | Hu et al. | 438/3 |
| 2006/0114618 A1 | 6/2006 | Hosomi et al. | |

OTHER PUBLICATIONS

Yiming Huai and Paul N. Nguyen, *Magnetic Element Utilizing Spin Transfer and an MRAM Device Using the Magnetic Element*, U.S. Appl. No. 11/114,946.
S. Yuasa, et al., *Spin-Polarized Resonant Tunneling in Magnetic Tunnel Junctions*, Science Magazine, vol. 297, Jul. 12, 2002, pp. 234-237.
P. LeClair, et al., *Sign reversal of spin polarization in Co/Ru/$Al_2O_3$/Co magnetic tunnel junctions*, Physical Review B, vol. 62, 2001, pp. 100406-1-4.
P. LeClair, et al., *Apparent Spin Polarization Decay in Cu-Dusted Co/$Al_2O_3$/Co Tunnel Junctions*, Physical Review Letters, vol. 84, No. 13, Mar. 27, 2000, pp. 2933-2936.

* cited by examiner

*Primary Examiner*—Kevin M. Picardat
(74) *Attorney, Agent, or Firm*—Strategic Patent Group, P.C.

(57) ABSTRACT

A method and system for providing a magnetic element are disclosed. The method and system include providing first and second pinned layers, a free layer, and first and second barrier layers between the first and second pinned layers, respectively, and the free layer. The first barrier layer is preferably crystalline MgO, which is insulating, and configured to allow tunneling through the first barrier layer. Furthermore, the first barrier layer has an interface with another layer, such as the free layer or the first pinned layer. The interface has a structure that provides a high spin polarization of at least fifty percent and preferably over eighty percent. The second barrier layer is insulating and configured to allow tunneling through the second barrier layer. The magnetic element is configured to allow the free layer to be switched due to spin transfer when a write current is passed through the magnetic element.

63 Claims, 9 Drawing Sheets

MTJ ELEMENTS WITH HIGH SPIN POLARIZATION LAYERS CONFIGURED FOR SPIN-TRANSFER SWITCHING AND SPINTRONICS DEVICES USING THE MAGNETIC ELEMENTS

FIELD OF THE INVENTION

The present invention relates to magnetic memory systems, and more particularly to a method and system for providing a magnetic element having an improved signal and that can be switched using a spin transfer effect at a lower switching current.

BACKGROUND OF THE INVENTION

FIGS. 1A and 1B depict conventional magnetic elements 10 and 10'. Such conventional magnetic elements 10/10' can be used in non-volatile memories, such as magnetic random access memories (MRAM). The conventional magnetic element 10 is a spin valve and includes a conventional antiferromagnetic (AFM) layer 12, a conventional pinned layer 14, a conventional nonmagnetic spacer layer 16 and a conventional free layer 18. Other layers (not shown), such as seed or capping layer may also be used. The conventional pinned layer 14 and the conventional free layer 18 are ferromagnetic. Thus, the conventional free layer 18 is depicted as having a changeable magnetization 19. The conventional nonmagnetic spacer layer 16 is conductive. The AFM layer 12 is used to fix, or pin, the magnetization of the pinned layer 14 in a particular direction. The magnetization of the free layer 18 is free to rotate, typically in response to an external magnetic field. The conventional magnetic element 10' depicted in FIG. 1B is a spin tunneling junction. Portions of the conventional spin tunneling junction 10' are analogous to the conventional spin valve 10. However, the conventional barrier layer 16' is an insulator that is thin enough for electrons to tunnel through in a conventional spin tunneling junction 10'. Note that only a single spin valve 10 is depicted, one of ordinary skill in the art will readily recognize that dual spin valves including two pinned layers and two nonmagnetic layers separating the pinned layers from the free layer can be used. Similarly, although only a single spin tunneling junction 10' is depicted, one of ordinary skill in the art will readily recognize that dual spin tunneling including two pinned layers and two barrier layers separating the pinned layers from the free layer, can be used.

Depending upon the orientations of the magnetization 19/19' of the conventional free layer 18/18' and the conventional pinned layer 14/14', respectively, the resistance of the conventional magnetic element 10/10', respectively, changes. When the magnetization 19/19' of the conventional free layer 18/18' is parallel to the magnetization of the conventional pinned layer 14/14', the resistance of the conventional magnetic element 10/10' is low. When the magnetization 19/19' of the conventional free layer 18/18' is antiparallel to the magnetization of the conventional pinned layer 14/14', the resistance of the conventional magnetic element 10/10' is high.

To sense the resistance of the conventional magnetic element 10/10', current is driven through the conventional magnetic element 10/10'. Typically in memory applications, current is driven in a CPP (current perpendicular to the plane) configuration, perpendicular to the layers of conventional magnetic element 10/10' (up or down, in the z-direction as seen in FIG. 1A or 1B). Based upon the change in resistance, typically measured using the magnitude of the voltage drop across the conventional magnetic element 10/10', the resistance state and, therefore, the data stored in the conventional magnetic element 10/10' can be determined.

It has been proposed that particular materials be used for the conventional magnetic element 10'. In such a conventional magnetic element 10', it has been proposed that ferromagnetic materials from the group of Ni, Co, and Fe, their alloys such as CoFe, CoFeNi, and low-moment ferromagnetic materials such as $CoFeB_x$ (where x is between five and thirty atomic percent), CoFeC, CoFeHf, or analogous materials be used for the pinned layer 14' and free layer 18'. For the conventional barrier layer 16', it has been proposed that amorphous $AlO_x$ or crystalline MgO having (100) or (111) texture be used. For such structures, a large magnetoresistance, up to several hundred percent difference between the high and low resistance states, can be achieved.

Spin transfer is an effect that may be utilized to switch the magnetizations 19/19' of the conventional free layers 18/18', thereby storing data in the conventional magnetic elements 10/10'. Spin transfer is described in the context of the conventional magnetic element 10', but is equally applicable to the conventional magnetic element 10. The following description of the spin transfer phenomenon is based upon current knowledge and is not intended to limit the scope of the invention.

When a spin-polarized current traverses a magnetic multilayer such as the spin tunneling junction 10' in a CPP configuration, a portion of the spin angular momentum of electrons incident on a ferromagnetic layer may be transferred to the ferromagnetic layer. Electrons incident on the conventional free layer 18' may transfer a portion of their spin angular momentum to the conventional free layer 18'. As a result, a spin-polarized current can switch the magnetization 19' direction of the conventional free layer 18' if the current density is sufficiently high (approximately $10^7$–$10^8$ A/cm$^2$) and the lateral dimensions of the spin tunneling junction are small (approximately less than two hundred nanometers). In addition, for spin transfer to be able to switch the magnetization 19' direction of the conventional free layer 18', the conventional free layer 18' should be sufficiently thin, for instance, generally less than approximately ten nanometers for Co. Spin transfer based switching of magnetization dominates over other switching mechanisms and becomes observable when the lateral dimensions of the conventional magnetic element 10/10' are small, in the range of few hundred nanometers. Consequently, spin transfer is suitable for higher density magnetic memories having smaller magnetic elements 10/10'.

Spin transfer can be used in the CPP configuration as an alternative to or in addition to using an external switching field to switch the direction of magnetization of the conventional free layer 18' of the conventional spin tunneling junction 10'. For example, the magnetization 19' of the conventional free layer 18' can be switched from antiparallel to the magnetization of the conventional pinned layer 14' to parallel to the magnetization of the conventional pinned layer 14'. Current is driven from the conventional free layer 18' to the conventional pinned layer 14' (conduction electrons traveling from the conventional pinned layer 14' to the conventional free layer 18'). The majority electrons traveling from the conventional pinned layer 14' have their spins polarized in the same direction as the magnetization of the conventional pinned layer 14'. These electrons may transfer a sufficient portion of their angular momentum to the conventional free layer 18' to switch the magnetization 19' of the conventional free layer 18' to be parallel to that of the conventional pinned layer 14'. Alternatively, the magnetization of the free layer 18' can be switched from a direction parallel to the magnetization of the conventional pinned layer 14' to antiparallel to the magnetization of the conventional pinned layer 14'. When current is driven from the conventional pinned layer 14' to the conventional free layer 18' (conduction electrons traveling in the opposite direction), majority electrons have their spins polarized in the direction of magnetization of the conventional free layer 18'. These majority electrons are transmitted by the conventional pinned layer 14'. The minority electrons are reflected from the conventional pinned layer 14', return to the conventional free layer 18' and may transfer a sufficient amount of their angular momentum to switch the magnetization 19' of the free layer 18' antiparallel to that of the conventional pinned layer 14'.

Although spin transfer can be used in switching the magnetization 19/19' of the conventional free layer 18/18', one of ordinary skill in the art will readily recognize that a high current density is typically required. In particular, the current required to switch the magnetization 19/19' is termed the critical current. As discussed above, the critical current corresponds to a critical current density that is approximately at least $10^7$ A/cm$^2$. One of ordinary skill in the art will also readily recognize that such a high current density implies that a high write current and a small magnetic element size are necessary.

Use of a high critical current for switching the magnetization 19/19' adversely affects the utility and reliability of such conventional magnetic elements 10/10' in a magnetic memory. The high critical current corresponds to a high write current. The use of a high write current is associated with increased power consumption, which is undesirable. The high write current may require that larger structures, such as isolation transistors, be used with the conventional magnetic element 10/10' to form memory cells. Consequently, the areal density of such a memory is reduced. In addition, the conventional magnetic element 10', which has a higher resistance and thus a higher signal, may be less reliable because the conventional barrier layer 16' may be subject to dielectric breakdown at higher write currents. Thus, even though a higher signal read may be achieved, the conventional magnetic elements 10/10' may be unsuitable for use in higher density conventional MRAMs using a high spin transfer switching current to write to the conventional magnetic elements 10/10'.

Accordingly, what is needed is a system and method for providing a magnetic memory element that can be switched using spin transfer at a lower write current. The present invention addresses such a need.

BRIEF SUMMARY OF THE INVENTION

The present invention provides a method and system for providing a magnetic element. The method and system comprise providing first and second pinned layers, a free layer, and first and second barrier layers between the first and second pinned layers, respectively, and the free layer. The first barrier layer is insulating and configured to allow tunneling through the first barrier layer. Furthermore, the first barrier layer has an interface with another layer, such as the free layer or the first pinned layer. The interface has a structure that provides a high spin polarization of at least fifty percent. The second barrier layer is insulating and configured to allow tunneling through the second barrier layer. The magnetic element is configured to allow the free layer to be switched due to spin transfer when a write current is passed through the magnetic element.

According to the method and system disclosed herein, the present invention provides a magnetic element having a higher signal and that can be written using spin transfer at a lower write current.

DETAILED DESCRIPTION OF THE INVENTION

The present invention relates to magnetic elements and magnetic memories such as MRAM. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein. The present invention is also described in the context of current knowledge for physical phenomenon. However, the present invention is not intended to be limited to specific explanations of physical phenomenon.

Figure 1A:
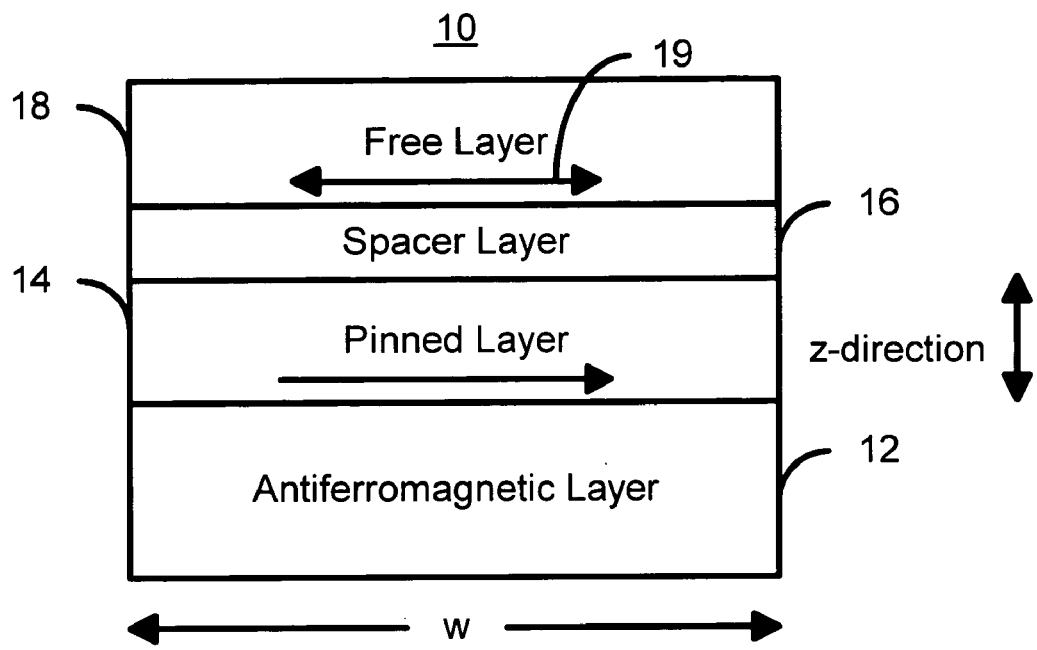
FIG. 1A is a diagram of a conventional magnetic element, a spin valve.
Figure 1B:
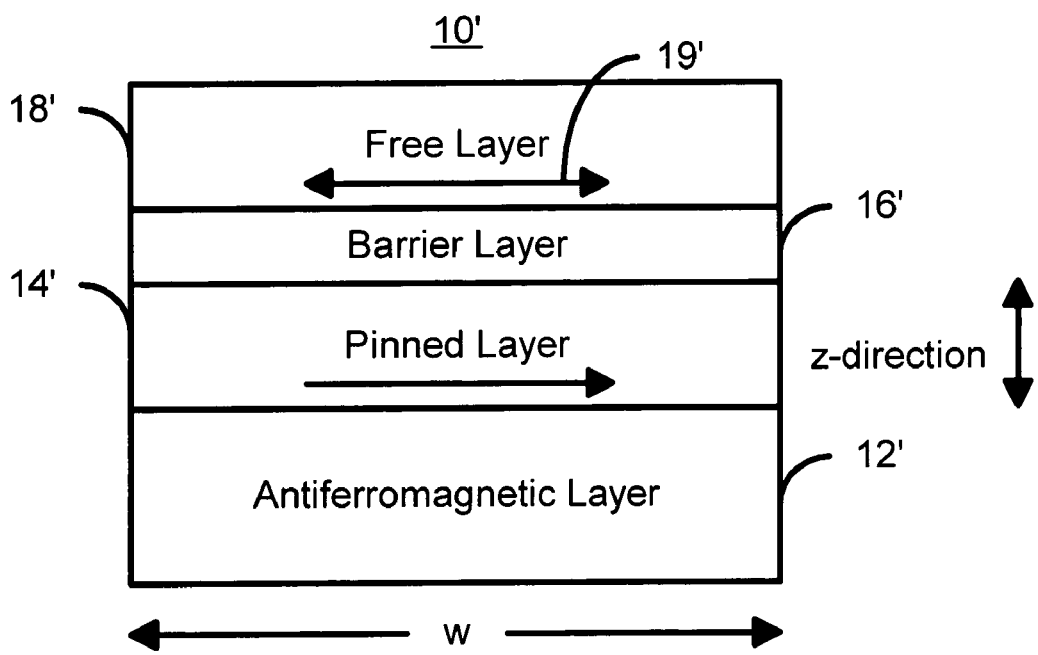
FIG. 1B is a diagram of another conventional magnetic element, a spin tunneling junction.
Figure 2:
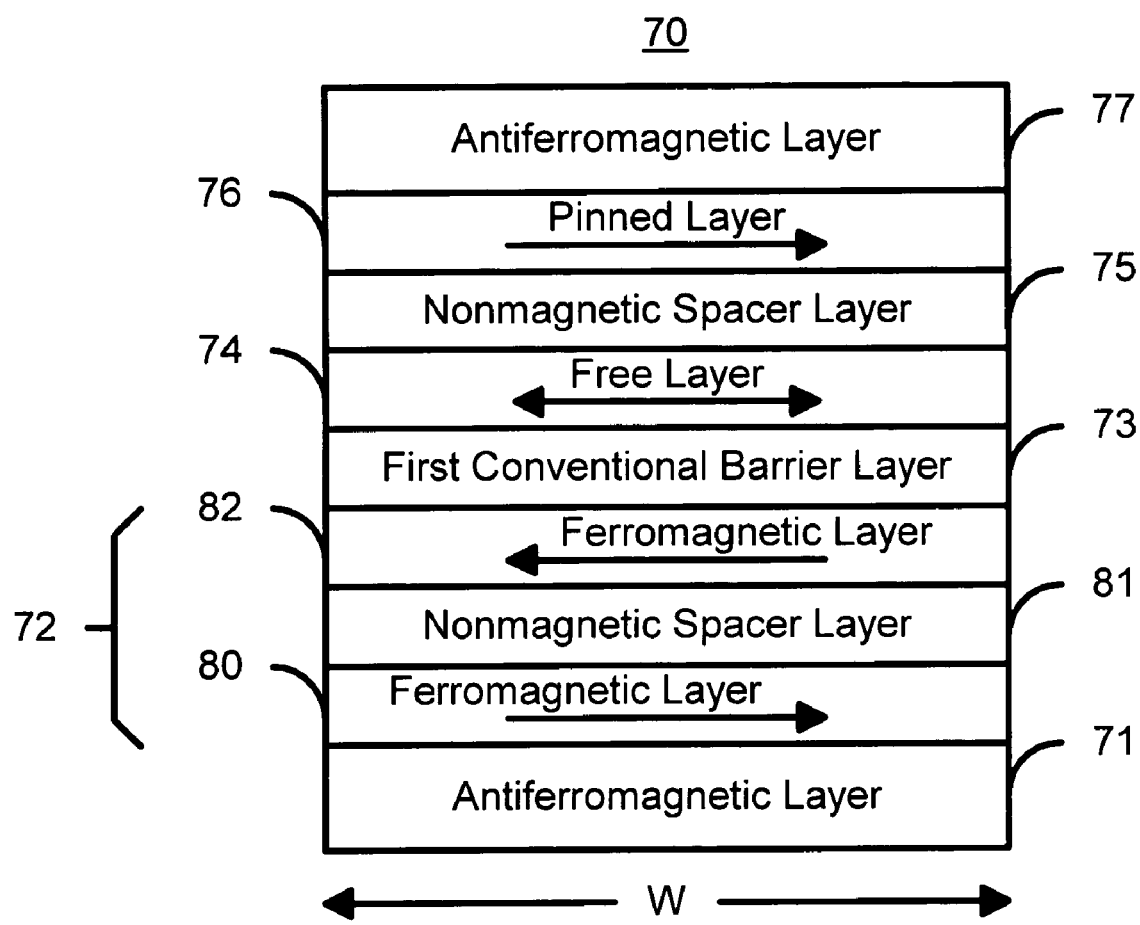
FIG. 2 is a diagram of a recently developed magnetic element, a dual magnetic tunneling junction/spin valve.

FIG. 2 is a diagram of one embodiment of a magnetic element termed a dual spin filter 70 that can be used as a magnetic element. The dual spin filter 70 includes a first AFM layer 71, a first pinned layer 72, a barrier layer 73, a free layer 74, a spacer layer 75, a second pinned layer 76, a second AFM layer 77. The dual spin filter 70 is preferably fabricated upon the appropriate seed layer and has an appropriate capping layer (not shown). The pinned layer 72 is depicted as a synthetic pinned layer including magnetic layers 80 and 82 separated by a nonmagnetic spacer layer 81, which is typically Ru. The barrier layer 73 is insulating and is thin enough to allow charge carriers to tunnel between the first pinned layer 72 and the free layer 74. The barrier layer 73 might be amorphous aluminum oxide or crystalline, including MgO preferably having (100) or (111) texture. The free layer 74 is ferromagnetic and has a magnetization that can be changed due to the spin transfer phenomenon. The spacer layer 75 is conductive and can include materials such as Cu. The second pinned layer 76 that is ferromagnetic and has a magnetization that is pinned by the AFM layer 77. In a preferred embodiment, the magnetizations of the ferromagnetic layers closest to the free layer 74 are antiferromagnetically aligned. Thus, the pinned layer 76 magnetization is in the opposite direction to the magnetization of the layer 82. The dual spin filter 70 can be considered to be made up of a spin tunneling junction or current confined junction (including layers 71, 72, 73 and 74) and a spin valve (including layers 74, 75, 76, and 77), which share a free layer 74. Consequently, a higher read signal can be achieved while allowing writing using spin transfer. Although described as single ferromagnetic films, the layers 72, 74 and 76 may be synthetic, and/or may be doped to improve the thermal stability of the dual spin filter 70. In addition, other magnetic elements having free layers that are magnetostatically coupled, including dual spin filters, having magnetostatically coupled free layers have been described. Consequently, other structures using magnetic elements such as spin tunneling junctions or dual spin filters can also be provided.

The dual spin filter 70 is configured to allow the magnetization of the free layer 74 to be switched using spin transfer. Consequently, the dimensions of the dual spin filter 70 are preferably small, in the range of few hundred nanometers to reduce the self field effect. In a preferred embodiment, the dimensions of the dual spin filter 70 are less than two hundred nanometers and preferably approximately one hundred nanometers. The dual spin filter 70 preferably has a depth, perpendicular to the plane of the page in FIG. 2, of approximately fifty nanometers to one hundred and fifty nanometers. The depth is preferably smaller than the width of the dual spin filter 70 so that the dual spin filter 70 has some shape anisotropy, ensuring that the free layer 74 has a preferred direction. In addition, the thickness of the free layer 74 is low enough so that the spin transfer is strong enough to rotate the free layer magnetization into alignment with the magnetizations of the pinned layers 72 and 76. In a preferred embodiment, the free layer 74 has a thickness of less than or equal to 10 nm. In addition, for a dual spin filter 70 having the preferred dimensions, a sufficient current density on the order of $10^7$ Amps/cm$^2$ can be provided at a relatively small current. For example, a current density of approximately $10^7$ Amps/cm$^2$ can be provided with a current of approximately 0.5 mA for a dual spin filter 70 having an ellipsoidal shape of 0.06×0.12 µm$^2$. As a result, the use of special circuitry for delivering very high currents may be avoided.

Thus, use of the dual spin filter 70 allows for the use of spin transfer as a switching mechanism and an improved signal. Moreover, the dual spin filter 70 may be fabricated such that it possesses a relatively low areal resistance. For example, areal resistances of below thirty Ohm-µm$^2$ may be achieved. Further, the magnetization of the free layer 74 may be kept relatively low, allowing the critical current for the dual spin filter 70 to be reduced.

Although the magnetic element 70 discussed above may function well for its intended purpose, one of ordinary skill in the art will also recognize that it is desirable to reduce the critical current required to switch the magnetic element 70. It would also be desirable to increase the signal from the magnetic element 70.

The present invention provides a method and system for providing a magnetic element. The method and system comprise providing first and second pinned layers, a free layer, and first and second barrier layers between the first and second pinned layers, respectively, and the free layer. The first barrier layer is insulating and configured to allow tunneling through the first barrier layer. Furthermore, the first barrier layer has an interface with another layer, such as the free layer or the first pinned layer. The interface has a structure that provides a high spin polarization of at least fifty percent. The second barrier layer is insulating and configured to allow tunneling through the second barrier layer. The magnetic element is configured to allow the free layer to be switched due to spin transfer when a write current is passed through the magnetic element.

The present invention will be described in terms of a particular magnetic memory and a particular magnetic element having certain components. However, one of ordinary skill in the art will readily recognize that this method and system will operate effectively for other magnetic memory elements having different and/or additional components and/or other magnetic memories having different and/or other features not inconsistent with the present invention. The present invention is also described in the context of current understanding of the spin transfer phenomenon, as well as spin polarization due to interfaces with barrier layers. Consequently, one of ordinary skill in the art will readily recognize that theoretical explanations of the behavior of the method and system are made based upon this current understanding of spin transfer and spin polarization. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the present invention is described in the context of magnetic elements having particular layers. However, one of ordinary skill in the art will readily recognize that magnetic elements having additional and/or different layers not inconsistent with the present invention could also be used. Moreover, certain components are described as being ferromagnetic. However, as used herein, the term ferromagnetic could include ferrimagnetic or like structures. Thus, as used herein, the term "ferromagnetic" includes, but is not limited to ferromagnets and ferrimagnets. The present invention is also described in the context of single elements. However, one of ordinary skill in the art will readily recognize that the present invention is consistent with the use of magnetic memories having multiple elements, bit lines, and word lines.

Figure 3:
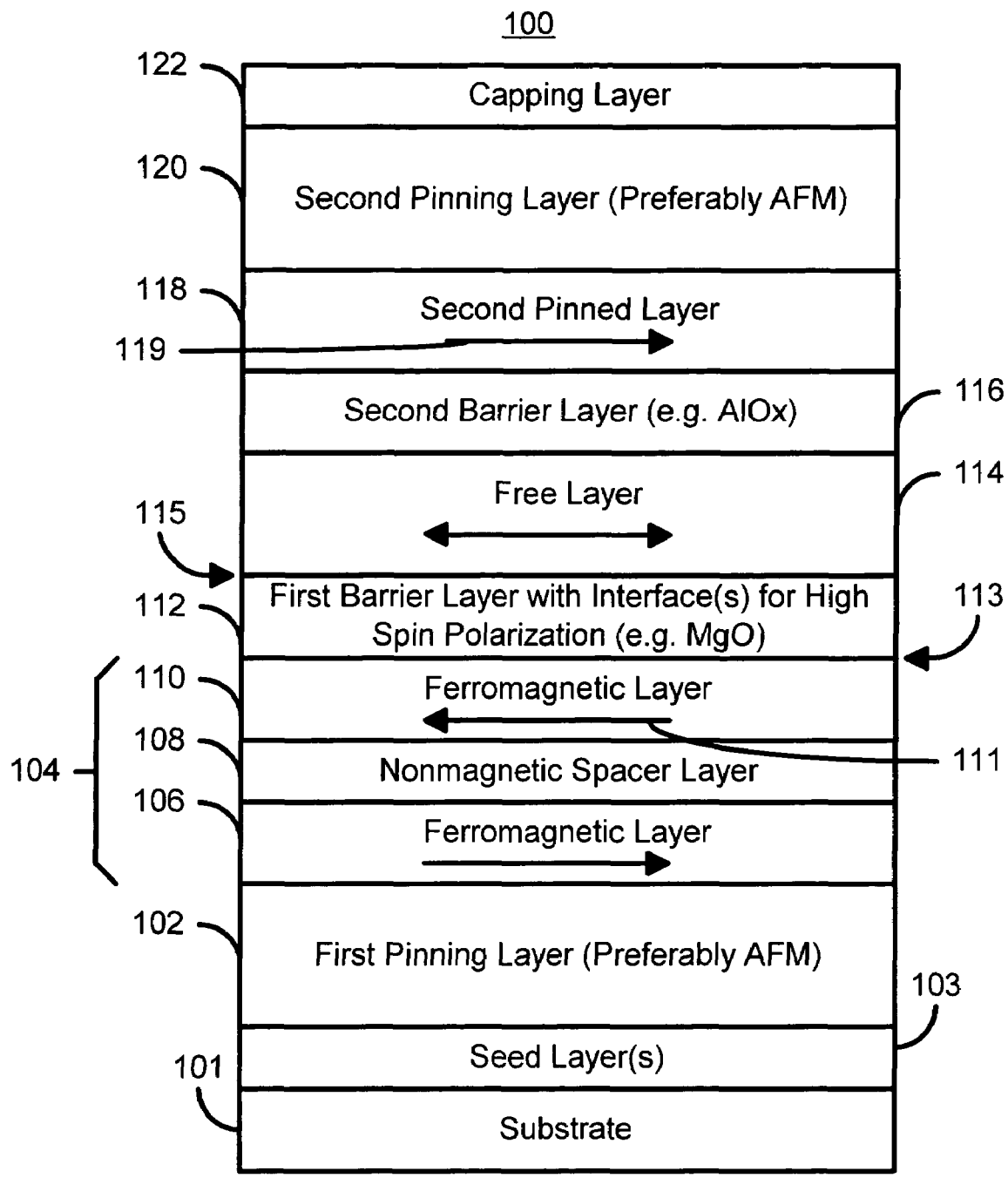
FIG. 3 is a diagram of a first embodiment of a magnetic element in accordance with the present invention and which can be written using spin transfer.

FIG. 3 is a diagram of a first embodiment of a magnetic element 100 in accordance with the present invention and which can be written using spin transfer. The magnetic element 100 includes a first pinning layer 102 that is preferably an AFM layer, first pinned layer 104, a first barrier layer 112, a free layer 114, a second barrier layer 116, a second pinned layer 118, and a second pinning layer 120. Also depicted are capping layer(s) 122. In an alternate embodiment, the first pinning layer 102 and/or the second pinning layer 120 may be omitted in favor of another mechanism for pinning the magnetizations of the pinned layers 104 and 118. In a preferred embodiment, the AFM layers 102 and 120 include materials such as PtMn and IrMn. In addition, seed layers 103 may be used on the substrate 101 to provide a desired texture of the AFM layer 102. Any ferromagnetic layers, such as the free layer 114, first pinned layer 104 (or ferromagnetic layers 106 and 110), and the second pinned layer 118 include at least one of Ni, Co, and Fe. For example, such materials include but are not limited to CoFe, CoFe, Ni, CoFeB (with B being at least five and no more than thirty atomic percent), CoFeC, and CoFeHf.

The first pinned layer 104 is depicted as being a synthetic pinned layer including ferromagnetic layers 106 and 110 separated by a nonmagnetic spacer layer $10^8$ that is conductive. In addition, the ferromagnetic layers 106 and 110 are preferably antiferromagnetically aligned. However, in an alternate embodiment, the first pinned layer 104 might be a simple layer. Similarly, the second pinned layer 118 is depicted as a simple layer. However, in an alternate embodiment, the second pinned layer 118 may be synthetic. Furthermore, the magnetizations of the pinned layers 104 and 118 closest to the free layer 114 are preferably antiparallel. Consequently, the magnetization 111 of the ferromagnetic layer 110 is preferably antiparallel to the magnetization 119 of the pinned layer 118.

The free layer 114 is depicted as being a simple free layer 114. However, the free layer 114 may also be synthetic, including ferromagnetic layers (not separately depicted) separated by a nonmagnetic spacer layer (not separately depicted). For example, in such an embodiment, the free layer 114 may be CoFe/Ru/CoFe, where the Ru may be at least two Angstroms and no more than twenty Angstroms in thickness. Depending upon the thickness of the Ru, the ferromagnetic layers may have their magnetizations aligned parallel or antiparallel.

The free layer 114 preferably has a low moment and/or a low perpendicular anisotropy. A low moment free layer 114 would have a saturation magnetization of no more than one thousand two hundred emu/cc and preferably between three hundred and one thousand emu/cc. A low perpendicular anisotropy free layer 114 would have a perpendicular anisotropy of no more than approximately six thousand Oe and more preferably between one hundred and five thousand Oe. The perpendicular magnetic anisotropy is defined as the field required to saturate the free layer moment along the axis perpendicular to the film plane.

The first barrier layer 112 includes an interface, such as interfaces 113 and 115, with another layer, preferably the pinned layer 104 (and thus the ferromagnetic layer 110) or the free layer 114. This interface 113 and/or 115 is configured to provide a high spin polarization of greater than fifty percent. In a preferred embodiment, this high spin polarization is at least eighty percent and preferably eighty-five percent. The high spin polarization is possible because of the spin densities at the Fermi level for the interface 113 and/or 115. In a preferred embodiment, this interface 113 and/or 115 and the attendant spin polarization are achieved by selecting the appropriate combinations of materials for the first barrier layer 112 and the pinned layer 104 or free layer 114. Because of the selection of materials, and the interface 113 and/or 115 formed between the layers 112 and 104 (110) and/or the layers 112 and 114 may have the appropriate structure for achieving the high spin polarization. In a preferred embodiment, the material for the first barrier layer 112 is MgO that is textured to be (100) or (111). Also in a preferred embodiment, the first pinned layer 104 (particularly the ferromagnetic layer 110) and/or the free layer 164 is amorphous or highly textured in the (100) or (111) directions.

Further, although the first barrier layer 112 closest to the substrate (bottom) is depicted as having this property related to spin polarization, in another embodiment, the second barrier layer 116 might have interface(s) with the second pinned layer 118 and/or the free layer 114 are configured to have a high spin polarization of at least fifty percent, and preferably at least eighty or eighty-five percent. In yet another embodiment, both the barrier layers 112 and 116 have interfaces with the layers 104 and/or 114 and layers 114 and/or 118 that provide a high spin polarization.

The magnetic element 100 is also configured to allow the free layer 114 to be switched due to spin transfer when a write current is passed through the magnetic element 100. In a preferred embodiment, the lateral dimensions, such as the width w, of the free layer 114 are thus small and preferably less than two hundred nanometers. In addition, some difference is preferably provided between the lateral dimensions to ensure that the free layer 114 has a particular easy axis.

Thus, the magnetic element 100 can be written using spin transfer. Further, because of the interfaces described above, such as the interfaces 113 and 115, a high spin polarization is achieved. As a result, the magnetoresistance signal of the magnetic element 100 may be increased. In addition, the majority of the signal is from the portion of the magnetic element 100 having the first barrier layer 112 between the layers 104 and 114. The signal from the magnetic element 100 may, therefore, be increased. For example, it is expected that a magnetoresistance of over one hundred and twenty percent may be achieved. Moreover, the RA for such a magnetic element 100 is relatively low, preferably on the order of ten to one hundred ohm-micrometer squared. Furthermore, because the magnetizations 119 and 111 are aligned antiparallel, switching current during spin transfer is additive. Consequently, the magnetization of the free layer 114 may be switched at lower currents. Moreover, the critical current required to switch the magnetization of the free layer 114 is inversely proportional to the spin polarization. Consequently, the critical current required to switch the magnetization of the free layer 112 might be further reduced. Thus, the power consumption and ability of the magnetic elements 100 to be used in higher density magnetic memories may be improved.

Figure 4:
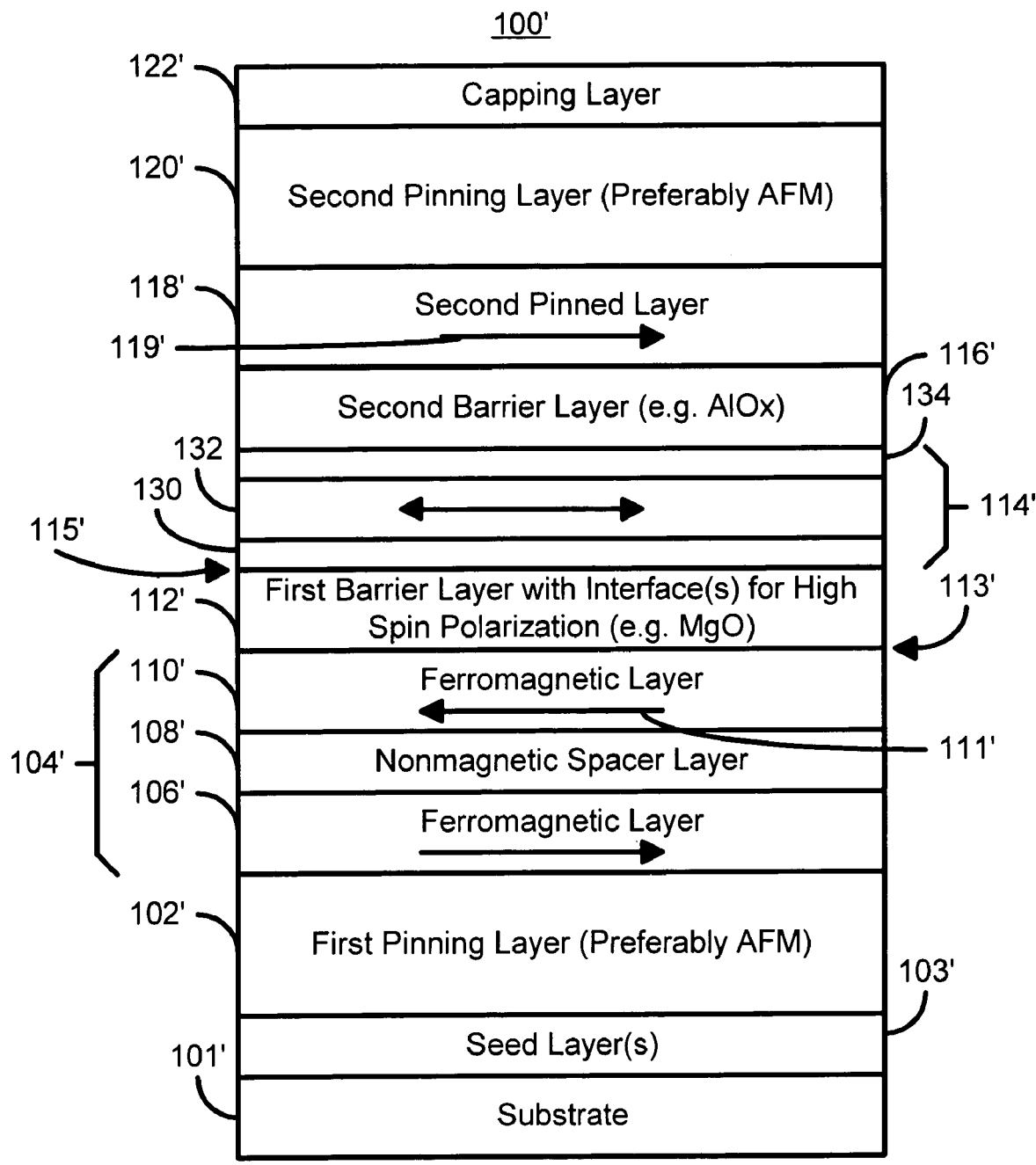
FIG. 4 is a diagram of a second version of the first embodiment of a magnetic element in accordance with the present invention and which can be written using spin transfer.

FIG. 4 is a diagram of a second version of the first embodiment of the magnetic element 100' in accordance with the present invention and which can be written using spin transfer. The magnetic element 100' is analogous to the magnetic element 100. Consequently, analogous components are labeled similarly. For example, the magnetic element 100' includes first pinned layer 102', first barrier layer 112', free layer 114', second barrier layer 116' and second pinned layer 118'.

The free layer 114' is a low moment free layer. However, the free layer 114' is not a simple free layer, or a synthetic free layer as described above. Instead, the free layer 114' contains high spin polarization layers 130 and 134 separated by layer 132. The layers 130, 132, and 134 are all ferromagnetic. However, the middle layer 132 has low moment and/or low perpendicular anisotropy. For example, layers 130 and 134 might include between two and ten Angstroms of CoFeB, while the layer 132 might include Permalloy-CoPt. Thus, the high spin polarization layers 130 and 134 form interfaces with the barrier layers 112' and 116', while the central portion of the free layer 114' has a low moment or low perpendicular anisotropy. Thus, the magnetic element 100' shares the benefits of the magnetic element 100.

Figure 5:
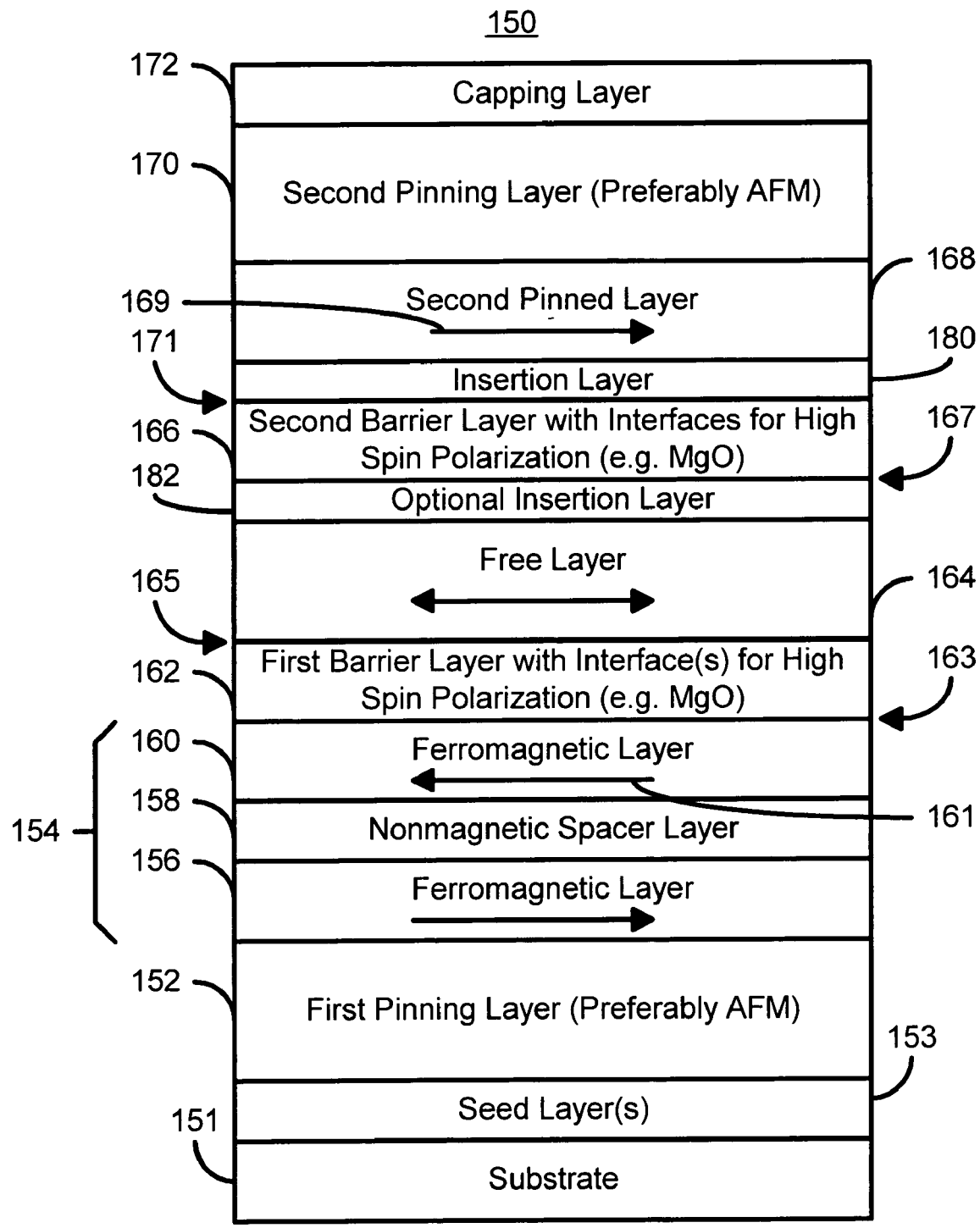
FIG. 5 is a diagram of a second embodiment of a magnetic element in accordance with the present invention and which can be written using spin transfer.

FIG. 5 is a diagram of a second embodiment of a magnetic element 150 in accordance with the present invention and which can be written using spin transfer. The magnetic element 150 includes a first pinning layer 152 that is preferably an AFM layer, first pinned layer 154, a first barrier layer 162, a free layer 164, a second barrier layer 166, a second pinned layer 168, and a second pinning layer 170. Also depicted are capping layer(s) 172. In an alternate embodiment, the first pinning layer 152 and/or the second pinning layer 170 may be omitted in favor of another mechanism for pinning the magnetizations of the pinned layers 154 and 168. In a preferred embodiment, the AFM layers 152 and 170 include materials such as PtMn and IrMn. In addition, seed layers 153 may be used on the substrate 151 to provide a desired texture of the AFM layer 152. Any ferromagnetic layers, such as the free layer 164, first pinned layer 154 (or ferromagnetic layers 156 and 160), and the second pinned layer 168 include at least one of Ni, Co, and Fe. For example, such materials include but are not limited to CoFe, Ni, CoFeB, $CoFeC_x$, $CoFeHf_x$, $CoPt_x$ and $CoPd_x$ (with x being at least five and no more than fifty atomic percent). The free layer 164 preferably has a low moment. Such a low moment free layer 164 would have a saturation magnetization of no more than one thousand two hundred emu/cc and preferably between three hundred and one thousand emu/cc. Alternatively, the free layer 164 could have a low perpendicular magnetic anisotropy value. Such a low perpendicular anisotropy free layer 164 would have a perpendicular anisotropy of no more than approximately six thousand Oe and more preferably between one hundred and five thousand Oe. Furthermore, the free layer 164 might be a trilayer, such as the free layer 114' depicted in FIG. 4. Referring back to FIG. 5, thus, in a preferred embodiment, the free layer 164 is configured to have a low perpendicular anisotropy and/or a low moment.

The first pinned layer 154 is depicted as being a synthetic pinned layer including ferromagnetic layers 156 and 160 separated by a nonmagnetic spacer layer 158 that is conductive. In addition, the ferromagnetic layers 156 and 160 are preferably antiferromagnetically aligned. However, in an alternate embodiment, the first pinned layer 154 might be a simple layer. Similarly, the second pinned layer 168 is depicted as a simple layer. However, in an alternate embodiment, the second pinned layer 168 may be synthetic. Furthermore, the magnetizations of the pinned layers 154 and 168 closest to the free layer 164 are preferably antiparallel. Consequently, the magnetization 161 of the ferromagnetic layer 160 is preferably antiparallel to the magnetization 169 of the pinned layer 168.

The free layer 164 is depicted as being a simple free layer 164. However, the free layer 164 may also be synthetic, including ferromagnetic layers (not separately depicted) separated by a nonmagnetic spacer layer (not separately depicted). For example, in such an embodiment, the free layer 164 may be CoFe/Ru/CoFe, where the Ru may be at least two Angstroms and no more than twenty Angstroms in thickness. Depending upon the thickness of the Ru, the ferromagnetic layers may have their magnetizations aligned parallel or antiparallel. In addition, the free layer 164 might be a trilayer having high spin polarization layers adjacent to the barrier layers 162 and 166 as well as a central low moment and/or low saturation magnetization layer.

The first barrier layer 162 includes an interface, such as interfaces 163 and 165, with another layer, preferably the pinned layer 154 (and thus the ferromagnetic layer 160) or the free layer 164. This interface 163 and/or 165 is configured to provide a high spin polarization of greater than fifty percent. In a preferred embodiment, this high spin polarization is at least eighty percent and preferably eighty-five percent. The high spin polarization is possible because of the spin densities at the Fermi level for the interface 163 and/or 165. In a preferred embodiment, this interface 163 and/or 165 and the attendant spin polarization are achieved by selecting the appropriate combinations of materials for the first barrier layer 162 and the pinned layer 154 or free layer 164. Because of the selection of materials, and the interface 163 and/or 165 formed between the layers 162 and 154 (160) and/or the layers 162 and 164 may have the appropriate structure for achieving the high spin polarization. In a preferred embodiment, the material for the first barrier layer 162 is MgO that is textured to be (100) or (111). Also in a preferred embodiment, the first pinned layer 154 (particularly the ferromagnetic layer 160) is amorphous or highly textured in the (100) or (111) directions.

Further, the second barrier layer 166 has interface(s) 171 and 167 with the second pinned layer 168 and/or the free layer 164, respectively, are configured to have a high spin polarization of at least fifty percent, and preferably at least eighty or eighty-five percent. In a preferred embodiment, this interface 167 and/or 171 and the attendant spin polarization are achieved by selecting the appropriate combinations of materials for the second barrier layer 166 and the second pinned layer 168 or free layer 164. Because of the selection of materials, and the interface 171 and/or 167 formed between the layers 168 and 166 and/or the layers 164 and 166 may have the appropriate structure for achieving the high spin polarization. In a preferred embodiment, the material for the second barrier layer 166 is amorphous $AlO_x$ or crystalline MgO that is textured to be (100) or (111). Also in a preferred embodiment, the second pinned layer 168 or the free layer 164 is amorphous or highly textured in the (100) or (111) directions.

Figure 6:
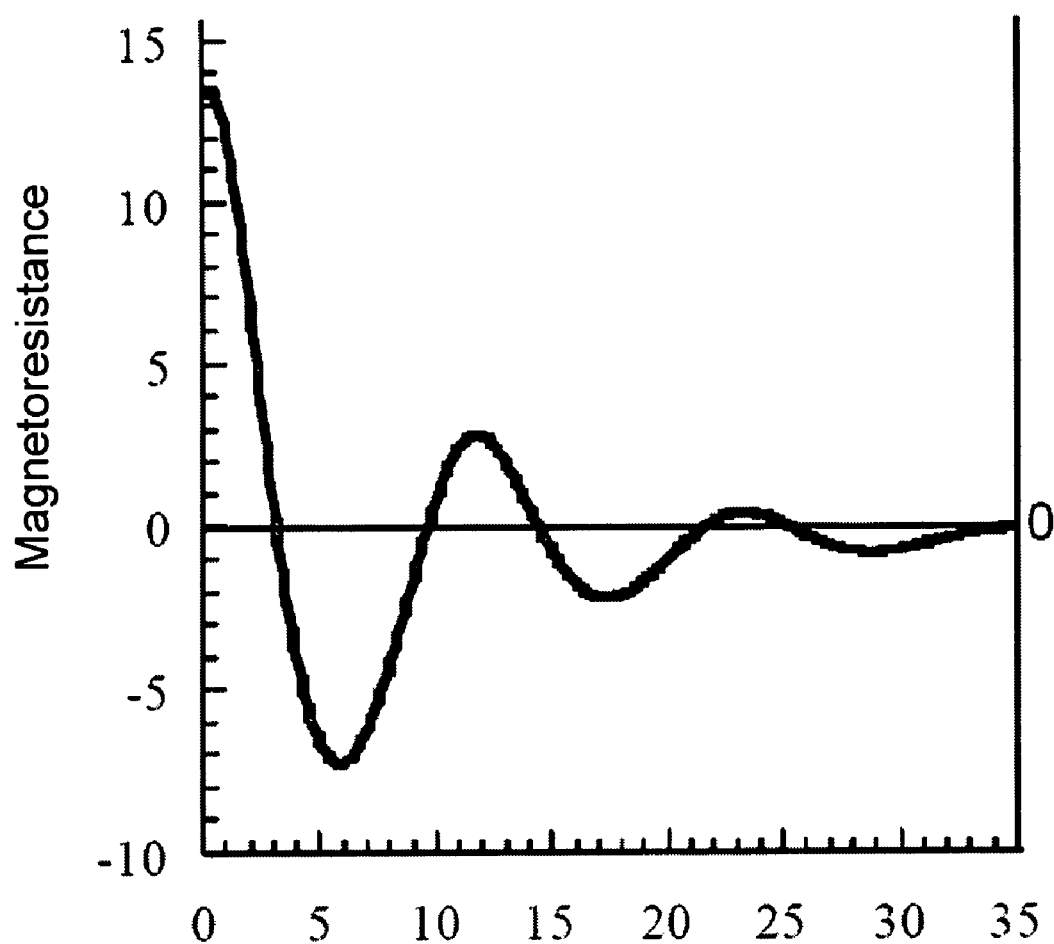
FIG. 6 is a graph depicting magnetoresistance versus insertion layer thickness for one version of the second embodiment of a magnetic element in accordance with the present invention.

The magnetic element 150 also includes an insertion layer 180. In addition or instead of the insertion layer 180, the magnetic element 150 may include the optional insertion layer 182. The insertion layer 180 or 182 is nonmagnetic and conducting. In one embodiment, the insertion layer 180 or 182 includes at least one of Cu, R, and Re and is at least two Angstroms thick and no more than fifteen Angstroms thick. The insertion layer 180 or 182 is used to modulate the magnetoresistance of the magnetic element 150. For example, FIG. 6 is a graph 190 depicting magnetoresistance versus insertion layer thickness for one version of the second embodiment of a magnetic element in accordance with the present invention. As can be seen from the graph 190, the signal varies with thickness of the insertion layer. Thus, by choosing the appropriate thickness of the insertion layer 180 or 182, it can be ensured that the insertion layer does not destructively contribute to the signal of the magnetic element 150.

The magnetic element 150 is also configured to allow the free layer 164 to be switched due to spin transfer when a write current is passed through the magnetic element 150. In a preferred embodiment, the lateral dimensions, such as the width w, of the free layer 164 are thus small and preferably less than two hundred nanometers. In addition, some difference is preferably provided between the lateral dimensions to ensure that the free layer 164 has a particular easy axis.

Thus, the magnetic element 150 can be written using spin transfer. Further, because of the interfaces described above, such as the interfaces 163, 165, 167, and/or 171, a high spin polarization is achieved. As a result, the magnetoresistance signal of the magnetic element 150 may be increased. The signal from the magnetic element 150 may, therefore, be increased. For example, it is expected that a magnetoresistance of over one hundred and twenty percent may be achieved. Moreover, the RA for such a magnetic element 150 is relatively low, preferably on the order of ten to one hundred ohm-micrometer squared. Furthermore, because the magnetizations 169 and 161 are aligned antiparallel, switching current during spin transfer is additive. Consequently, the magnetization of the free layer 164 may be switched at lower currents. Moreover, the critical current required to switch the magnetization of the free layer 164 is inversely proportional to the spin polarization. Consequently, the critical current required to switch the magnetization of the free layer 164 might be further reduced. Thus, the power consumption and ability of the magnetic elements 150 to be used in higher density magnetic memories may be improved.

Figure 7:
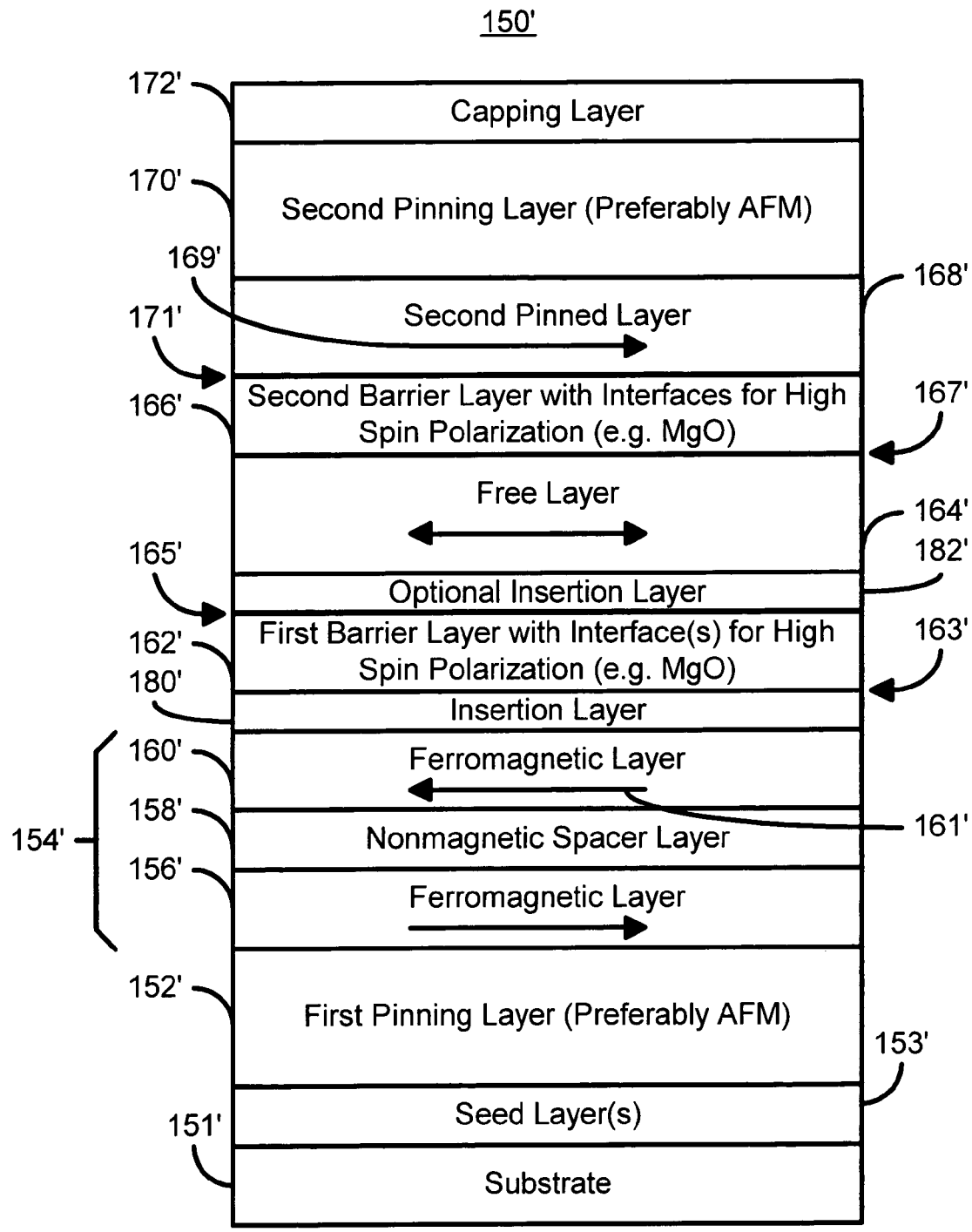
FIG. 7 is a diagram of a second version of the second embodiment of a magnetic element in accordance with the present invention and which can be written using spin transfer.

FIG. 7 is a diagram of a second version of the second embodiment 150' of a magnetic element in accordance with the present invention and which can be written using spin transfer. The magnetic element 150' is analogous to the magnetic element 150. Consequently, analogous components are labeled similarly. For example, the magnetic element 150' includes first pinned layer 154', first barrier layer 162', free layer 164', second barrier layer 166' and second pinned layer 168'.

The magnetic element 150' includes optional insertion layers 180' and 182'. However, in contrast to the magnetic element 150 depicted in FIG. 4, the insertion layer 180' resides between the first pinned layer 160' and the barrier layer 162'. Similarly, the optional insertion layer 182' resides between the first barrier layer 162' and the free layer 164'. The insertion layer(s) 180' and 182' function in an analogous manner as discussed above. Consequently, the magnetic element 150' shares the benefits of the magnetic element 150.

Figure 8:
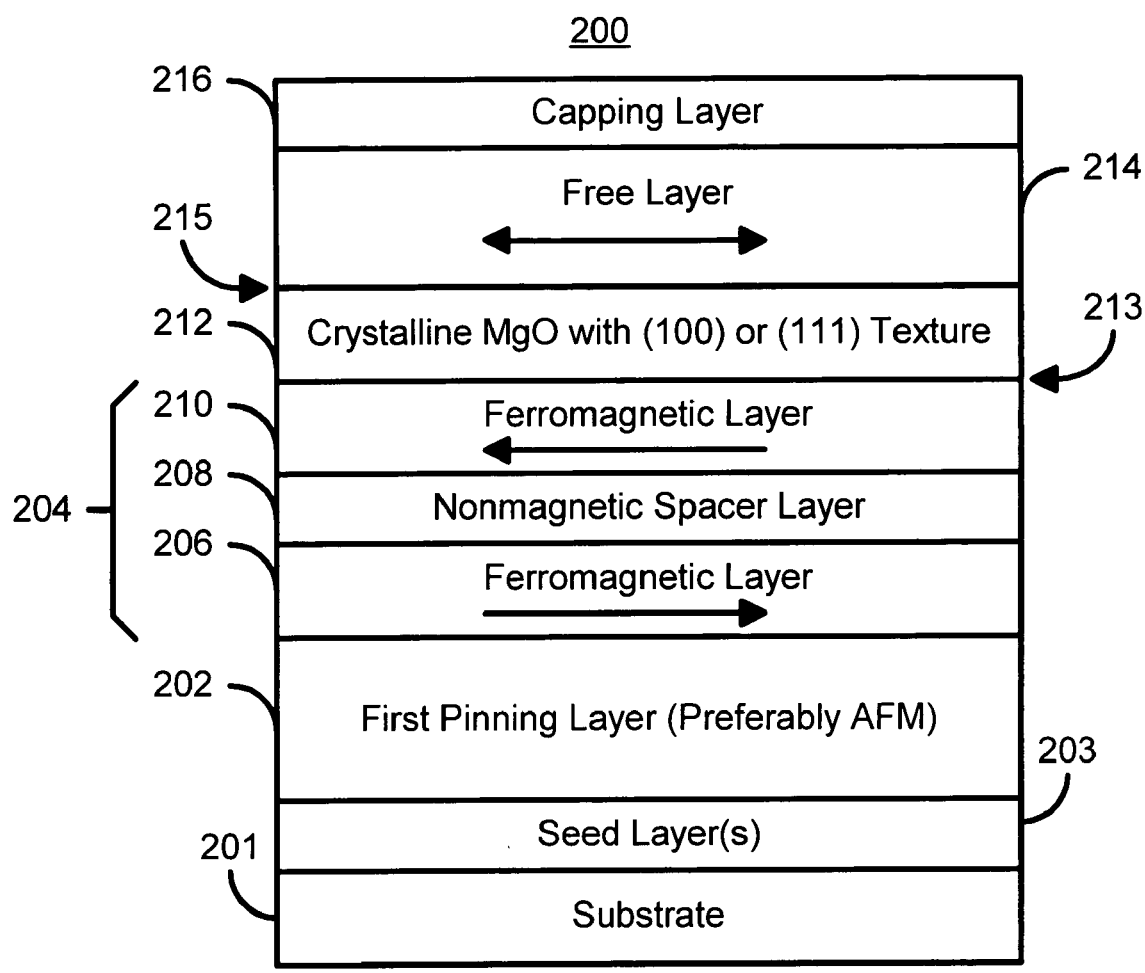
FIG. 8 is a diagram of a third embodiment of a magnetic element in accordance with the present invention and which can be written using spin transfer.

FIG. 8 is a diagram of a third embodiment of a magnetic element 200 in accordance with the present invention and which can be written using spin transfer. The magnetic element 200 includes a pinning layer 202 that is preferably an AFM layer, pinned layer 204, a barrier layer 212, and a free layer 214. Also depicted are capping layer(s) 216. In an alternate embodiment, the pinning layer 202 may be omitted in favor of another mechanism for pinning the magnetizations of the pinned layer 204. In a preferred embodiment, the AFM layer 202 includes materials such as PtMn and IrMn. In addition, seed layers 203 may be used on the substrate 201 to provide a desired texture of the AFM layer 202. Any ferromagnetic layers, such as the free layer 214 and pinned layer 204 (or ferromagnetic layers 206 and 210) include at least one of Ni, Co, and Fe. For example, such materials include but are not limited to CoFe, CoFe, Ni, CoFeB (with B being at least five and no more than thirty atomic percent), CoFeC, and CoFeHf. Thus, the magnetic element 200 may be considered to be a special case of part of one of the magnetic elements 100, 100', 150 and 150'.

The pinned layer 204 is depicted as being a synthetic pinned layer including ferromagnetic layers 206 and 210 separated by a nonmagnetic spacer layer 208 that is conductive. In addition, the ferromagnetic layers 206 and 210 are preferably antiferromagnetically aligned. However, in an alternate embodiment, the first pinned layer 104 might be a simple layer.

The free layer 214 is depicted as being a simple free layer 214. However, the free layer 214 may also be synthetic, including ferromagnetic layers (not separately depicted) separated by a nonmagnetic spacer layer (not separately depicted). For example, in such an embodiment, the free layer 214 may be CoFe/Ru/CoFe, where the Ru may be at least two Angstroms and no more than twenty Angstroms in thickness. Depending upon the thickness of the Ru, the ferromagnetic layers may have their magnetizations aligned parallel or antiparallel. The free layer 214 has a low moment and/or a low perpendicular anisotropy. In one embodiment, the free layer 214 thus has a saturation magnetization of no more than one thousand two hundred emu/cc and preferably between three hundred and one thousand emu/cc. In another embodiment, the free layer 214 would have a low perpendicular anisotropy of no more than approximately six thousand Oe and more preferably between one hundred and five thousand Oe.

The barrier layer 212 is composed of crystalline MgO having a (100) or (111) texture. As a result, the barrier layer 212 includes interfaces 113 and 115. This interface 113 and/or 115 is configured to provide a high spin polarization of greater than fifty percent. In a preferred embodiment, this high spin polarization is at least eighty percent and preferably eighty-five percent. Also in a preferred embodiment, the pinned layer 104 (particularly the ferromagnetic layer 210) and/or the free layer 264 are amorphous or highly textured in the (100) or (111) directions. In addition, although not depicted, an insertion layer such as the insertion layers 180 and 182 might be provided.

The magnetic element 200 is also configured to allow the free layer 214 to be switched due to spin transfer when a write current is passed through the magnetic element 200. In a preferred embodiment, the lateral dimensions, such as the width w, of the free layer 214 are thus small and preferably less than two hundred nanometers. In addition, some difference is preferably provided between the lateral dimensions to ensure that the free layer 214 has a particular easy axis. Consequently, the magnetic element 200 can be switched at a relatively low spin transfer switching current, while providing a high magnetoresistance signal.

Figure 9:
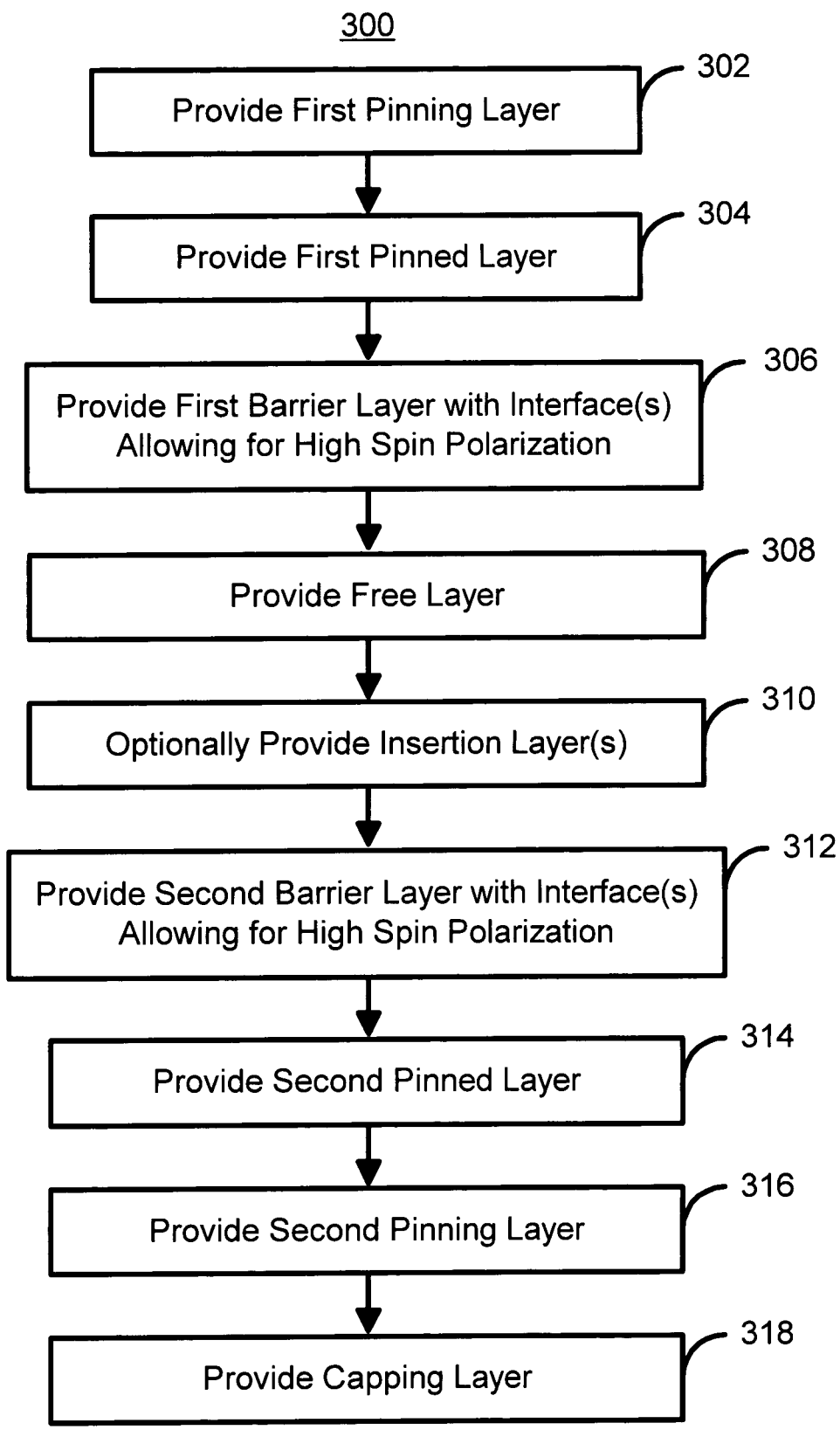
FIG. 9 is a diagram depicting one embodiment of a method in accordance with the present invention for providing magnetic element in accordance which can be written using spin transfer.

FIG. 9 is a diagram depicting one embodiment of a method 300 in accordance with the present invention for providing magnetic element in accordance which can be written using spin transfer. For clarity, the method 300 is described in the context of the magnetic element 150. However, nothing prevents the use of the method 300 with certain other magnetic elements. The method 300 is also described in the context of providing a single magnetic element. However, one of ordinary skill in the art will readily recognize that multiple elements may be provided.

The method 300 preferably commences after the seed layer(s) 153 have been provided. The first pinning layer 152 is provided, via step 302. The first pinned layer 154 is provided, via step 304. Step 304 preferably includes providing a synthetic pinned layer, having ferromagnetic layers 156 and 160 separated by a nonmagnetic spacer layer 158. The first barrier layer 162 is provided, via step 306. Step 306 includes providing the first barrier layer 162 composed of the desired materials and texture so that the spin polarization at the desired interface(s) is high. Step 306 also includes providing the first barrier layer 162 such that tunneling through the first barrier layer 162 between the pinned layer 160 and free layer 164 is allowed. The free layer 164 is provided, via step 308. Step 308 may include providing a synthetic free layer having magnetic layer that are separated by a nonmagnetic spacer layer and that have their magnetizations either parallel or anti-parallel. Note that if the magnetic element 200 were being provided, step 308 would essentially complete the magnetic element 200.

Optional insertion layer(s) 180, 182, 180' and/or 182' are provided, via step 310. Note that step 310 could be performed earlier or later in the process 300 so that the optional insertion layer(s) 180, 182, 180' and/or 182' are in the desired location. In addition, step 310 may include forming multiple layers at different points in the process. The second barrier layer 168 is provided, via step 312. Step 312 preferably includes providing the second barrier layer 166 composed of the desired materials and texture so that the spin polarization at the desired interface(s) is high. Step 312 also includes providing the second barrier layer 166 such that tunneling through the second barrier layer 166 between the second pinned layer 168 and free layer 164 is allowed.

The second pinned layer 154 is provided, via step 314. Step 314 preferably includes providing a synthetic pinned layer, having ferromagnetic layers 156 and 160 separated by a nonmagnetic spacer layer 158. The second AFM layer 170 is provided, via step 316. Any capping layers may then be provided, via step 318.

Thus, the magnetic element 100, 100', 150, 150', or 200 may be fabricated. Consequently, using the method 200, a magnetic element 100, 100', 150, 150', and 200 that can be written using spin transfer, that may have a higher signal and a reduced critical current for writing using spin transfer may be fabricated.

A method and system for providing a magnetic element capable of being written using spin transfer has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A magnetic element comprising:
a first pinned layer;
a first barrier layer, the first barrier layer being insulating and configured to allow tunneling through the first barrier layer, the first barrier layer having an interface with another layer, the interface having a structure that provides a high spin polarization of at least fifty percent;
a free layer, the first barrier layer residing between the first pinned layer and the free layer;
a second barrier layer, the free layer residing between the first barrier layer and the second barrier layer, the second barrier layer being insulating and configured to allow tunneling through the second barrier layer;
a second pinned layer, the second barrier layer residing between the free layer and the second pinned layer;
wherein the magnetic element is configured to allow the free layer to be switched due to spin transfer when a write current is passed through the magnetic element.

2. The magnetic element of claim 1 wherein the first pinned layer has a first crystallographic texture.

3. The magnetic element of claim 2 wherein the first crystallographic texture is (100) and (111).

4. The magnetic element of claim 1 wherein the first barrier layer includes crystalline MgO having a texture of (100) and (111).

5. The magnetic element of claim 1 wherein the first pinned layer has an amorphous structure.

6. The magnetic element of claim 1 wherein the second barrier layer further includes an oxide of aluminum.

7. The magnetic element of claim 1 wherein the first pinned layer has a first magnetization pinned in a first direction, the second pinned layer has a second magnetization pinned in a second direction opposite from the first direction.

8. The magnetic element of claim 1 wherein the free layer is a synthetic free layer including a first magnetic layer, a second magnetic layer and a nonmagnetic spacer layer between the first magnetic layer and the second magnetic layer.

9. The magnetic element of claim 8 wherein the nonmagnetic spacer layer includes Ru, Cu, Ir, Re and Rh and has a thickness of between about two and twenty Angstroms.

10. The magnetic element of claim 9 wherein the first magnetic layer has a first magnetization, the second magnetic layer has a second magnetization, and wherein the first magnetization and the second magnetization are parallel.

11. The magnetic element of claim 9 wherein the first magnetic layer has a first magnetization, the second magnetic layer has a second magnetization, and wherein the first magnetization and the second magnetization are anti-parallel.

12. The magnetic element of claim 1 wherein the first pinned layer is a synthetic pinned layer including a first magnetic layer, a second magnetic layer and a nonmagnetic spacer layer between the first magnetic layer and the second magnetic layer.

13. The magnetic element of claim 12 wherein the second pinned layer is a synthetic pinned layer which includes a first magnetic layer, a second magnetic layer, a third magnetic layer, a first nonmagnetic spacer layer, and a second nonmagnetic spacer layer, the first nonmagnetic spacer layer residing between the first magnetic layer and the second magnetic layer, the second nonmagnetic spacer layer residing between the second magnetic layer and the third magnetic layer.

14. The magnetic element of claim 1 wherein the first pinned layer, the free layer, and the second pinned layer include at least one of Ni, Co, and Fe.

15. The magnetic element of claim 1 wherein the first pinned layer, the free layer, and the second pinned layer include at least one of $CoFeB_x$, $CoFeC_x$, $CoFeHf_x$, $CoPt_x$, $CoPd_x$ with x from about five to about fifty atomic percent.

16. The magnetic element of claim 1 where the free layer is a low moment free layer.

17. The magnetic element of claim 16 wherein the low moment free layer has a saturation magnetization between 300 emu/cc and 1000 emu/cc.

18. The magnetic element of claim 1 where the free layer has a low perpendicular anisotropy value between 100 Oe and 5000 Oe.

19. The magnetic element of claim 1 wherein the free layer is a tri-layer including a first layer, a second layer, and a third layer, the second layer sandwiched between the first layer and the third layer, the first layer being adjacent to the first barrier layer and having a first spin high polarization, the third layer being adjacent to the second barrier layer and having a second high spin polarization, the second layer either having low moment or a low perpendicular anisotropy.

20. The magnetic element of claim 1 wherein the interface is between the free layer and the first barrier layer.

21. The magnetic element of claim 1 wherein the interface is between the first pinned layer and the first barrier layer.

22. The magnetic element of claim 1 wherein the spin polarization is at least fifty percent.

23. The magnetic element of claim 22 wherein the spin polarization is about eighty-five percent.

24. The magnetic element of claim 1 wherein the second barrier layer includes a second interface with a third layer, the second interface having a second structure that provides a second high spin polarization of at least fifty percent.

25. The magnetic element of claim 1 further comprising:
an interface layer residing between the first barrier layer and the first pinned layer, the interface layer being conductive and nonmagnetic.

26. The magnetic element of claim 21 wherein the interface layer includes at least one of Cu, Ru, Rh, Ir and Re.

27. The magnetic element of claim 1 further comprising:
an interface layer residing between the first barrier layer and the free layer, the interface layer being conductive and nonmagnetic.

28. The magnetic element of claim 1 further comprising:
an interface layer residing between the second barrier layer and the second pinned layer, the interface layer being conductive and nonmagnetic, the second barrier layer including a second interface with a third layer, the second interface having a second structure that provides a second high spin polarization of at least fifty percent.

29. The magnetic element of claim 1 further comprising:
an interface layer residing between the second barrier layer and the free layer, the interface layer being conductive and nonmagnetic, the second barrier layer including a second interface with a third layer, the second interface having a second structure that provides a second high spin polarization of at least fifty percent.

30. A magnetic element comprising:
a first pinned layer;
a first barrier layer, the first barrier layer being insulating and configured to allow tunneling through the first barrier layer, the first barrier layer having an interface with another layer, the interface having a structure that provides a high spin polarization of at least fifty percent, the first barrier layer including MgO;
a free layer, the first barrier layer residing between the first pinned layer and the free layer;
a second barrier layer, the free layer residing between the first barrier layer and the second barrier layer, the second barrier layer being insulating and configured to allow tunneling through the second barrier layer, the second barrier layer including at least one of MgO and aluminum oxide;
a second pinned layer, the second barrier layer residing between the free layer and the second pinned layer;
wherein the magnetic element is configured to allow the free layer to be switched due to spin transfer when a write current is passed through the magnetic element.

31. The magnetic element comprising:
a pinned layer;
a barrier layer, the barrier layer being crystalline MgO having a 100 or 111 texture and being configured to allow tunneling through the barrier layer;
a free layer, the barrier layer residing between the pinned layer and the free layer, the free layer having at least one of a low moment and a low perpendicular anisotropy;
wherein the magnetic element is configured to allow the free layer to be switched due to spin transfer when a write current is passed through the magnetic element.

32. The magnetic element of claim 31 wherein the free layer has a saturation magnetization between 300 emu/cc and 1000 emu/cc.

33. The magnetic element of claim 31 where the free layer has the low perpendicular anisotropy value between 100 Oe and 5000 Oe.

34. The magnetic element of claim 31 wherein the free layer is a bi-layer including a first portion and a second portion, the first portion being adjacent to the barrier layer and having a spin high polarization, the second portion of the free layer having the low moment or the low perpendicular anisotropy.

35. The magnetic element of claim 34 further comprising:
a second barrier layer, the free layer residing between the second barrier layer and the barrier layer; and
a second pinned layer, the second barrier layer residing between the free layer and the second pinned layer, the second barrier layer being configured to allow tunneling through the second barrier layer.

36. A method for providing a magnetic element comprising:
providing a first pinned layer;
providing a first barrier layer, the first barrier layer being insulating and configured to allow tunneling through the first barrier layer, the first barrier layer having an interface with another layer, the interface having a structure that provides a high spin polarization of at least fifty percent;
providing a free layer, the first barrier layer residing between the first pinned layer and the free layer;
providing a second barrier layer, the free layer residing between the first barrier layer and the second barrier layer, the second barrier layer being insulating and configured to allow tunneling through the second barrier layer;
providing a second pinned layer, the second barrier layer residing between the free layer and the second pinned layer;
wherein the magnetic element is configured to allow the free layer to be switched due to spin transfer when a write current is passed through the magnetic element.

37. The method of claim 36 wherein the pinned layer providing step further includes:
providing the pinned layer having a first crystallographic texture or amorphous structure.

38. The method of claim 37 wherein the first crystallographic texture is (100) and (111).

39. The method of claim 36 wherein the first barrier layer providing step further includes:
providing crystalline MgO having a texture of (100) and (111).

40. The method of claim 36 wherein providing the second barrier layer further includes:
providing the second barrier layer further including an oxide of aluminum.

41. The method of claim 36 wherein the first pinned layer has a first magnetization pinned in a first direction, the second pinned layer has a second magnetization pinned in a second direction opposite from the first direction.

42. The method of claim 36 wherein the free layer providing further includes:
providing a synthetic free layer including a first magnetic layer, a second magnetic layer and a nonmagnetic spacer layer between the first magnetic layer and the second magnetic layer.

43. The method of claim 42 wherein the nonmagnetic spacer layer includes either Ru, Ru, Cu, Ir or Rh and has a thickness of between about two and twenty Angstroms.

44. The method of claim 43 wherein the first magnetic layer has a first magnetization, the second magnetic layer has a second magnetization, and wherein the first magnetization and the second magnetization are parallel.

45. The method of claim 42 wherein the first magnetic layer has a first magnetization, the second magnetic layer has a second magnetization, and wherein the first magnetization and the second magnetization are anti-parallel.

46. The method of claim 36 wherein the first pinned layer providing step further includes:
providing a synthetic pinned layer including a first magnetic layer, a second magnetic layer, a third magnetic layer and a first nonmagnetic spacer layer between the first magnetic layer and the second magnetic layer and a second nonmagnetic spacer between the second magnetic layer and the third magnetic layer.

47. The method of claim 36 wherein the first pinned layer, the free layer, and the second pinned layer include at least one of $CoFeB_x$, $CoFeC_x$, $CoFeHf_x$, $CoPt_x$, $CoPd_x$ with x from about five to about fifty atomic percent.

48. The method of claim 36 wherein interface is between the free layer and the first barrier layer.

49. The method of claim 36 wherein the interface is between the first pinned layer and the first barrier layer.

50. The method of claim 36 wherein the spin polarization is at least fifty percent.

51. The method of claim 50 wherein the spin polarization is about eighty-five percent.

52. The method of claim 36 wherein the second barrier layer includes a second interface with a third layer, the second interface having a second structure that provides a second high spin polarization of at least fifty percent.

53. The method of claim 36 further comprising:
providing an interface layer residing between the first barrier layer and the first pinned layer, the interface layer being conductive and nonmagnetic.

54. The method of claim 53 wherein the interface layer includes at least one of Cu, Ru, Rh, Ir and Re.

55. The method of claim 36 further comprising:
providing an interface layer residing between the first barrier layer and the free layer, the interface layer being conductive and nonmagnetic.

56. The method of claim 36 further comprising:
providing an interface layer residing between the second barrier layer and the second pinned layer, the interface layer being conductive and nonmagnetic, the second barrier layer including a second interface with a third layer, the second interface having a second structure that provides a second high spin polarization of at least fifty percent.

57. The method of claim 36 further comprising:
providing an interface layer residing between the second barrier layer and the free layer, the interface layer being conductive and nonmagnetic, the second barrier layer including a second interface with a third layer, the second interface having a second structure that provides a second high spin polarization of at least fifty percent.

58. The magnetic element of claim 12 wherein the free layer is a synthetic free layer including a third magnetic layer, a fourth magnetic layer and a second nonmagnetic spacer layer between the third magnetic layer and the fourth magnetic layer.

59. The magnetic element of claim 58 wherein the second pinned layer is a second synthetic pinned layer including a fifth magnetic layer, a sixth magnetic layer and a third nonmagnetic spacer layer between the fifth magnetic layer and the sixth magnetic layer.

60. The magnetic element of claim 31 wherein the pinned layer is a synthetic pinned layer including a first magnetic layer, a second magnetic layer and a first nonmagnetic spacer layer between the first magnetic layer and the second magnetic layer.

61. The magnetic element of claim 60 wherein the free layer is a synthetic free layer including a third magnetic layer, a fourth magnetic layer and a second nonmagnetic spacer layer between the third magnetic layer and the fourth magnetic layer.

62. The method of claim 42 wherein the first pinned layer providing further includes:
providing a synthetic first pinned layer including a third magnetic layer, a fourth magnetic layer and a second nonmagnetic spacer layer between the third magnetic layer and the fourth magnetic layer.

63. The method of claim 62 wherein the second pinned layer providing further includes:
providing a synthetic second pinned layer including a fifth magnetic layer, a sixth magnetic layer and a third nonmagnetic spacer layer between the fifth magnetic layer and the sixth magnetic layer.

* * * * *